US012751101B2

(12) United States Patent
Kwon et al.

(10) Patent No.: US 12,751,101 B2
(45) Date of Patent: Sep. 29, 2026

(54) IMAGE SENSOR AND MANUFACTURING METHOD OF IMAGE SENSOR

(71) Applicant: SAMSUNG ELECTRONICS CO., LTD., Suwon-si (KR)

(72) Inventors: Dohyun Kwon, Suwon-si (KR); Sangchun Park, Suwon-si (KR); Sungyong You, Suwon-si (KR); Dong-Chul Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 348 days.

(21) Appl. No.: 18/426,734

(22) Filed: Jan. 30, 2024

(65) Prior Publication Data

US 2024/0387585 A1 Nov. 21, 2024

(30) Foreign Application Priority Data

May 16, 2023 (KR) ........................ 10-2023-0063018

(51) Int. Cl.
*H10F 39/00* (2025.01)
*H10F 39/18* (2025.01)

(52) U.S. Cl.
CPC ......... *H10F 39/807* (2025.01); *H10F 39/014* (2025.01); *H10F 39/18* (2025.01)

(58) Field of Classification Search
CPC ...... H10F 39/807; H10F 39/014; H10F 39/18; H10F 39/024; H10F 39/199; H10F 39/8053; H10F 39/8063; H10F 39/811; H10F 39/802
See application file for complete search history.

(56) References Cited

U.S. PATENT DOCUMENTS

| | | | | |
|---|---|---|---|---|
| 9,780,142 | B1 * | 10/2017 | Koo | H10F 39/8057 |
| 11,502,117 | B2 | 11/2022 | Ha et al. | |
| 2020/0135716 | A1 * | 4/2020 | Kim | H10D 84/811 |
| 2021/0143191 | A1 * | 5/2021 | Ha | H10F 39/199 |
| 2022/0165761 | A1 * | 5/2022 | Lee | H10F 39/807 |
| 2022/0238590 | A1 | 7/2022 | Hiramatsu et al. | |
| 2022/0271070 | A1 | 8/2022 | Nakazawa et al. | |
| 2022/0271077 | A1 | 8/2022 | Lee et al. | |
| 2022/0302191 | A1 | 9/2022 | Jin et al. | |
| 2022/0328553 | A1 | 10/2022 | Oh et al. | |

FOREIGN PATENT DOCUMENTS

WO 2020/262643 A1 12/2020

* cited by examiner

*Primary Examiner* — Mark W Tornow
(74) *Attorney, Agent, or Firm* — Sughrue Mion, PLLC

(57) ABSTRACT

An image sensor comprises a substrate that comprises a first surface, a second surface facing the first surface, and a plurality of pixel regions disposed along a first direction and a second direction. The sensor comprises a plurality of ground regions that are disposed within a portion of the substrate along a depth direction perpendicular to the first direction and the second direction from the first surface of the substrate. The sensor comprises a deep trench that extends from the first surface of the substrate to the second surface of the substrate. The sensor comprises a shallow trench that extends into the portion of the substrate along the depth direction from the first surface of the substrate and is disposed at an outer edge of at least a portion of the deep trench.

10 Claims, 14 Drawing Sheets

IMAGE SENSOR AND MANUFACTURING METHOD OF IMAGE SENSOR

CROSS-REFERENCE TO RELATED APPLICATION

This application claims priority to and the benefit of Korean Patent Application No. 10-2023-0063018 filed in the Korean Intellectual Property Office on May 16, 2023, the entire contents of which are incorporated herein by reference.

BACKGROUND

1. Field

The present disclosure relates to an image sensor and a manufacturing method of the image sensor.

2. Description of the Related Art

A CMOS image sensor is a solid-state imaging element using a complementary metal-oxide semiconductor (CMOS). The CMOS image sensor has advantages of low manufacturing cost and low power consumption due to a small size of the solid-state imaging element compared with a CCD image sensor with a high voltage analog circuit. As a result of this small size, the CMOS image sensor is mainly installed at a home appliance including a portable device such as a smart phone, a digital camera, or the like.

A pixel array constituting the CMOS image sensor includes a photoelectric conversion element such as a photodiode for each pixel. The photoelectric conversion element may generate an electrical signal that varies according to an amount of incident light, and the CMOS image sensor may process the electrical signal to synthesize an image.

Recently, a pixel constituting the CMOS image sensor has been required to be further down-sized according to a demand for a high-resolution image.

As the pixel of the image sensor is miniaturized, a degree of integration may increase and an aspect ratio (e.g., a ratio of a depth to a width of a trench disposed between elements) may increase. Thus, a problem such as a void or the like may occur inside the trench.

SUMMARY

Embodiments are to provide an image sensor and a manufacturing method of the image sensor capable of increasing a degree of integration without generating a void or the like even when an aspect ratio of a trench increases.

However, problems to be solved by one or more embodiments are not limited to the above-described problem and may be variously extended in a range of technical ideas included in one or more embodiments.

According to one or more embodiments, an image sensor comprises a substrate that comprises a first surface, a second surface facing the first surface, and a plurality of pixel regions disposed along a first direction and a second direction different from the first direction; and a plurality of ground regions that are disposed within a portion of the substrate along a depth direction perpendicular to the first direction and the second direction from the first surface of the substrate; a deep trench that extends from the first surface of the substrate to the second surface of the substrate and defines the plurality of pixel regions within the substrate; and a shallow trench that extends into the portion of the substrate along the depth direction from the first surface of the substrate and is disposed at an outer edge of at least a portion of the deep trench, the shallow trench having a depth less than the deep trench; where on a plane where the first direction and the second direction intersect, the deep trench and the shallow trench are disposed between two ground regions of the plurality of ground regions disposed along the first direction and the deep trench is disposed between two ground regions of the plurality of ground regions disposed along the second direction.

According to one or more embodiments, a manufacturing method of an image sensor, comprises forming a shallow trench extending into a portion of a substrate along a depth direction from a first surface of the substrate having the first surface and a second surface facing each other; forming a first preliminary region and a second preliminary region extending into the portion of the substrate along the depth direction from the first surface of the substrate and divided by the shallow trench on a plane parallel to the first surface; and forming a deep trench that includes a first portion overlapping the shallow trench and a second portion intersecting the first portion and crossing the first preliminary region and the second preliminary region and extends from the first surface of the substrate to the second surface of the substrate, where the shallow trench has a depth less than the deep trench.

According to one or more embodiments, it is possible to provide the image sensor and the manufacturing method of the image sensor capable of increasing a degree of integration without generating a void or the like even when an aspect ratio of a trench increases.

As understood by one of ordinary skill in the art, an effect of one or more embodiments is not limited to the above-described effect, and may be variously extended without departing from the spirit and scope of the present disclosure.

DETAILED DESCRIPTION

Figure 1:
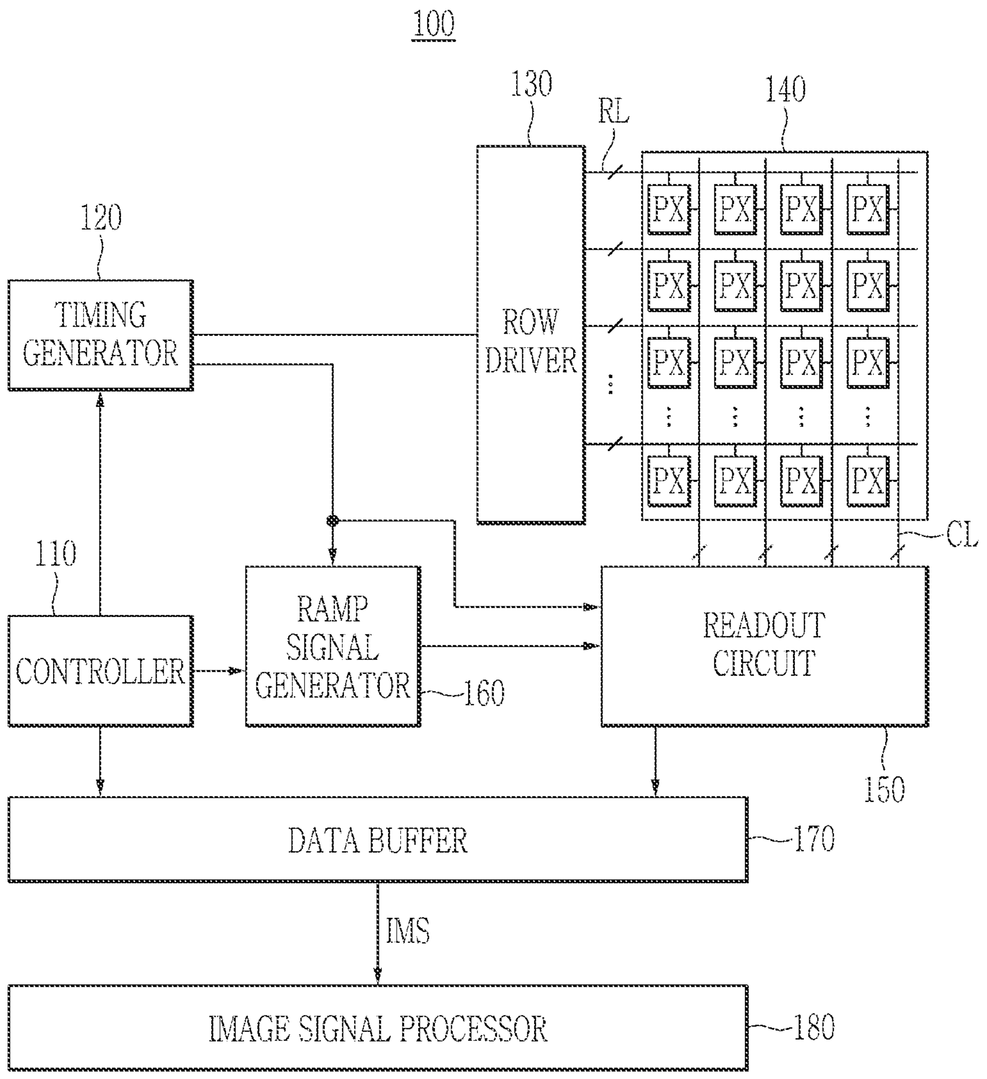
FIG. 1 is a block diagram schematically showing an image sensor according to one or more embodiments.

The present disclosure will be described more fully hereinafter with reference to the accompanying drawings, in which embodiments of the disclosure are shown. As those skilled in the art would realize, the described embodiments may be modified in various different ways, all without departing from the spirit or scope of the present disclosure.

In order to clearly describe the present disclosure, parts or portions that are irrelevant to the description are omitted, and identical or similar constituent elements throughout the specification are denoted by the same reference numerals.

Further, the accompanying drawings are provided only in order to allow embodiments disclosed in the present specification to be easily understood and are not to be interpreted as limiting the spirit disclosed in the present specification, and it is to be understood that the present disclosure includes all modifications, equivalents, and substitutions without departing from the scope and spirit of the present disclosure.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas, etc., are exaggerated for clarity. In the drawings, for ease of description, the thicknesses of some layers and areas are exaggerated.

It will be understood that when an element such as a layer, film, region, area, or substrate is referred to as being "on" or "above" another element, it may be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Furthermore, throughout the specification, "connected" does not only mean when two or more elements are directly connected, but also when two or more elements are indirectly connected through other elements, and when they are physically connected or electrically connected, and further, it may be referred to by different names depending on a position or function, and may also be referred to as a case in which respective parts that are substantially integrated are linked to each other. Hereinafter, various embodiments and variations will be described in detail with reference to the drawings.

Referring to FIG. 1, an image sensor according to one or more embodiments will be schematically described. FIG. 1 is a block diagram schematically showing the image sensor according to one or more embodiments.

Referring to FIG. 1, the image sensor 100 according to one or more embodiments may include a pixel array 140 and a logic circuit controlling the pixel array 140.

The logic circuit may be a circuit for controlling the pixel array 140, and may include a controller 110, a timing generator 120, a row driver 130, a readout circuit 150, a ramp signal generator 160, a data buffer 170, or any other suitable circuit element known to one of ordinary skill in the art.

In addition, the image sensor 100 may further include an image signal processor 180, and according to one or more embodiments, the image signal processor 180 may be disposed outside (e.g., external to) the image sensor 100, where the image sensor 100 receives signals from the image signal processor 180 and transmits signals to the image signal processor 180. The image sensor 100 may generate an image signal by converting light received from an external light source to an electrical signal. The image signal may be provided to the image signal processor 180.

The image sensor 100 may be mounted on an electronic device having an image or optical sensing function. For example, the image sensor 100 may be mounted on an electronic device such as a camera, a smart phone, a wearable device, an Internet of Things (IoT) device, a home appliance, a tablet personal computer (PC), a navigation device, a drone, an advanced drivers assistance system (ADAS), or any other suitable device known to one of ordinary skill in the art. In addition, the image sensor 100 may be mounted on an electronic device provided as a component in a vehicle, furniture, manufacturing equipment, a door, various measurement devices, or the like.

The pixel array 140 may include a plurality of pixels PX, a plurality of row lines RL respectively connected to the plurality of pixels PX, and a plurality of column lines CL.

In one or more embodiments, each pixel PX may include at least one photoelectric conversion element. The photoelectric conversion element may sense incident light, and may convert incident light to an electrical signal according to an amount of light that is a plurality of analog pixel signals.

The photoelectric conversion element may be a photodiode, a pinned diode, or any other diode element known to one of ordinary skill in the art. In addition, the photoelectric conversion element may be a single-photon avalanche diode (SPAD) applied to a 3D sensor pixel.

A level of the analog pixel signal output from the photoelectric conversion element may be proportional to an amount of a charge output from the photoelectric conversion element. For example, the level of the analog pixel signal output from the photoelectric conversion element may be determined according to an amount of light received within the pixel array 140.

The plurality of row lines RL may be connected to the plurality of pixels PX. For example, a control signal output from the row driver 130 to the row line RL may be transferred to gates of transistors of the plurality of pixels PX connected to the corresponding row line RL. The column line CL may be disposed to cross the row line RL, and may be connected to the plurality of pixels PX. A plurality of pixel signals output from the plurality of pixels PX may be transferred to the readout circuit 150 through the plurality of column lines CL.

In one or more embodiments, the plurality of pixels PX may be grouped in a form of a plurality of columns and a plurality of rows to form one unit pixel group. For example, the plurality of pixels PX disposed in an arrangement direction of the column line CL and the plurality of pixels PX disposed in an arrangement direction of the row line RL may constitute the one unit pixel group PG. For example, the one unit pixel group PG may include the plurality of pixels PX disposed in a form of two columns and two rows, and the one unit pixel group PG may output one analog pixel signal. However, the embodiments are not limited thereto, and numerous variations are possible.

The controller 110 may control an operation timing of each of the above-described components 120, 130, 150, 160, and 170 using control signals.

In one or more embodiments, the controller 110 may receive a mode signal indicating an imaging mode from an application processor, and may generally control the image sensor 100 based on the received mode signal. For example, the application processor may determine the imaging mode of the image sensor 100 according to one or more conditions such as illuminance of an imaging environment, a resolution setting of a user, a sensed or learned state, or any other condition, and may provide the determined result to the controller 110 as the mode signal.

The controller 110 may control the plurality of pixels PX of the pixel array 140 to output a pixel signal according to the imaging mode, the pixel array 140 may generate a pixel signal for each of the plurality of pixels PX or a pixel signal for some of the plurality of pixels PX, and the readout circuit 150 may sample and process pixel signals received from the pixel array 140.

The timing generator 120 may generate a signal serving as a reference for operation timing of components of the image sensor 100. The timing generator 120 may control timing of the row driver 130, the readout circuit 150, and the ramp signal generator 160. The timing generator 120 may provide a control signal for controlling the timing of the row driver 130, the readout circuit 150, and the ramp signal generator 160.

The row driver 130 may generate a control signal for driving the pixel array 140 in response to the control signal of the timing generator 120, and may provide the control signal to the plurality of pixels PX of the pixel array 140 through the plurality of row lines RL.

In one or more embodiments, the row driver 130 may control the pixels PX to sense incident light in a unit of a row line. The unit of the row line may include at least one row line RL. For example, the row driver 130 may generate a transmission signal for controlling a transmission transistor, a reset control signal for controlling a reset transistor, a selection control signal for controlling a selection transistor, or any other suitable signal to provide the generated signals to the pixel array 140.

The readout circuit 150 may convert the pixel signal (or an electrical signal) from a pixel PX of the plurality of pixels PX connected to a selected row line RL to a pixel value representing an amount of light in response to the control signal from the timing generator 120.

The readout circuit 150 may convert the pixel signal output through the column line CL to a pixel value. For example, the readout circuit 150 may convert the pixel signal to the pixel value by comparing the pixel signal with a ramp signal. The pixel value may be image data having a plurality of bits. Specifically, the readout circuit 150 may include a selector, a plurality of comparators, a plurality of counter circuits, and the like.

The ramp signal generator 160 may generate a reference signal to transmit the reference signal to the readout circuit 150. The ramp signal generator 160 may include a current source, a resistor, and a capacitor. The ramp signal generator 160 may adjust a current size of a variable current source or a resistance value of a variable resistor to adjust a ramp voltage that is a voltage applied to a ramp resistor. Thus, the ramp signal generator 160 may generate a plurality of ramp signals that fall or rise with a slope determined according to the current size of the variable current source or the resistance value of the variable resistor.

The data buffer 170 may store pixel values of the plurality of pixels PX connected to a selected column line CL transferred from the readout circuit 150, and may output the stored pixel values in response to an enable signal from the controller 110.

The image signal processor 180 may perform image signal processing on the image signal received from the data buffer 170. For example, the image signal processor 180 may receive a plurality of image signals from the data buffer 170, and may synthesize the received image signals to generate one image.

Figure 2:
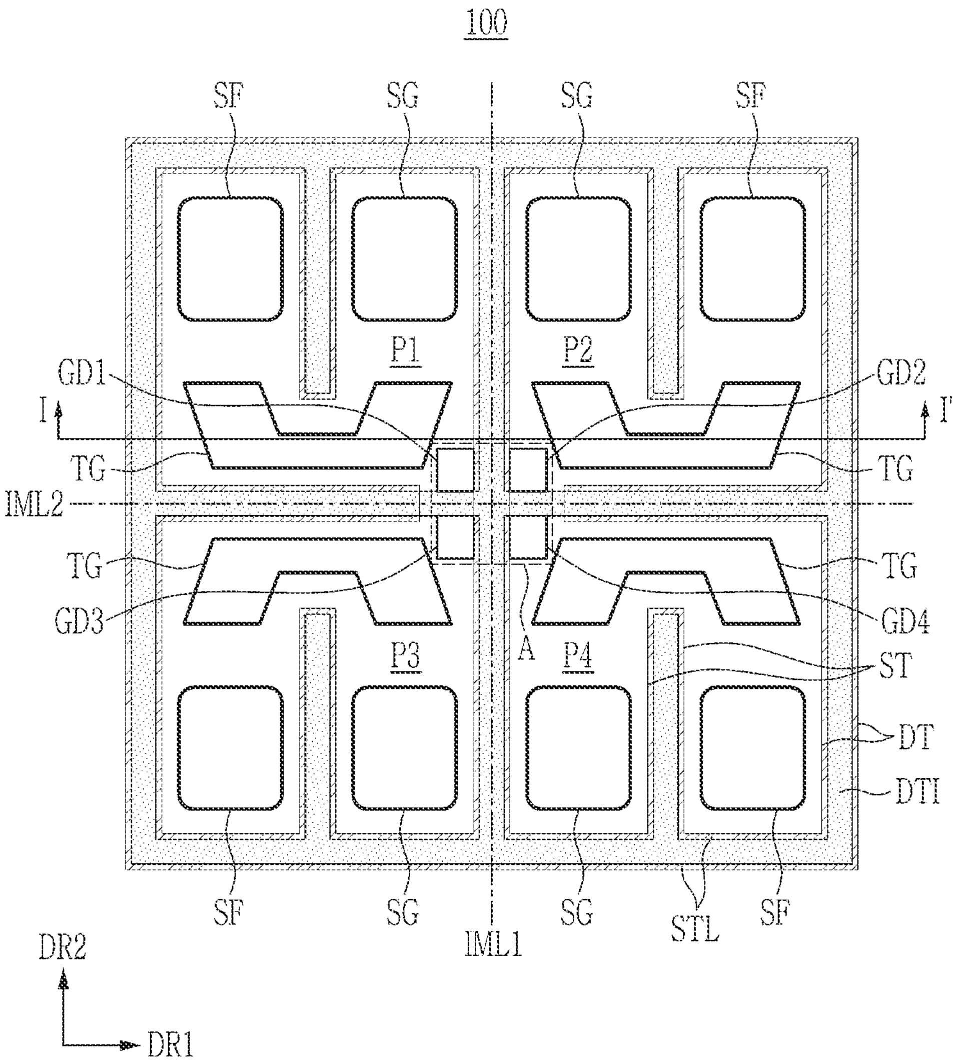
FIG. 2 is a plane view schematically showing the image sensor according to one or more embodiments.
Figure 3:
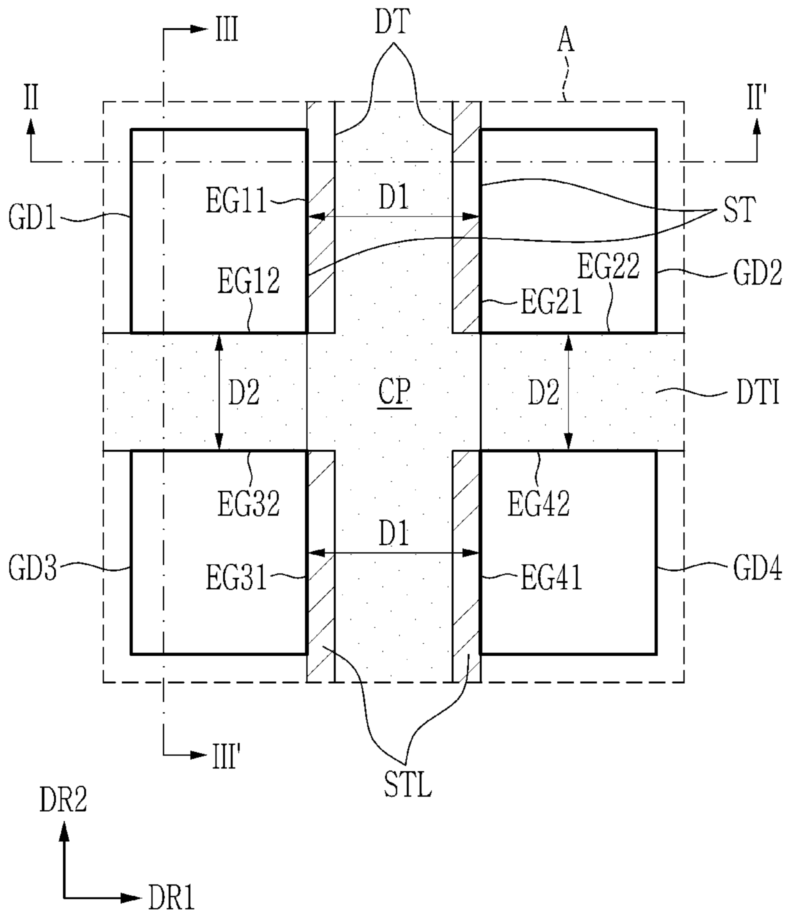
FIG. 3 is an enlarged view of a portion of FIG. 2.
Figure 4:
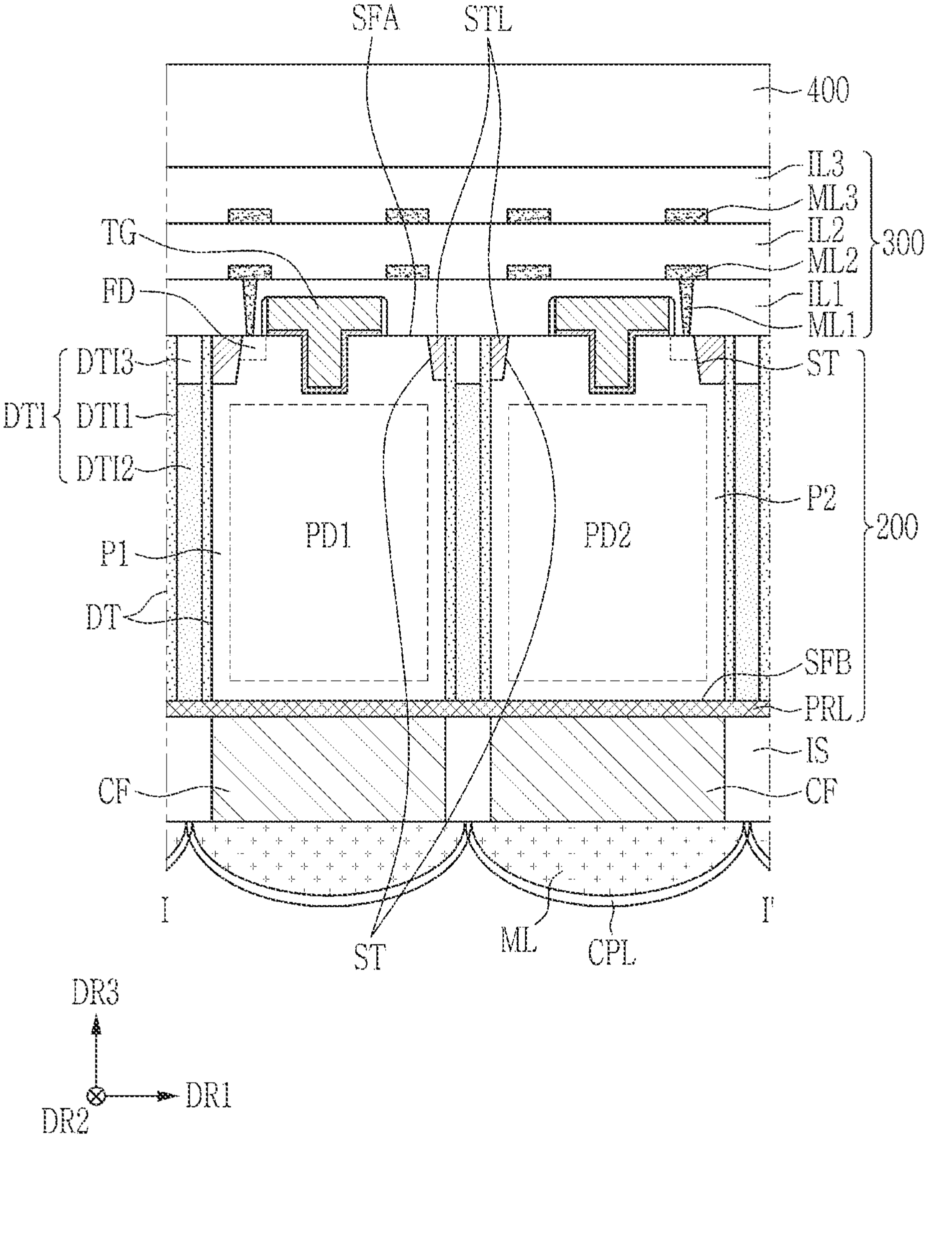
FIG. 4 is a cross-sectional view taken along a line I-I' of FIG. 2.
Figure 5:
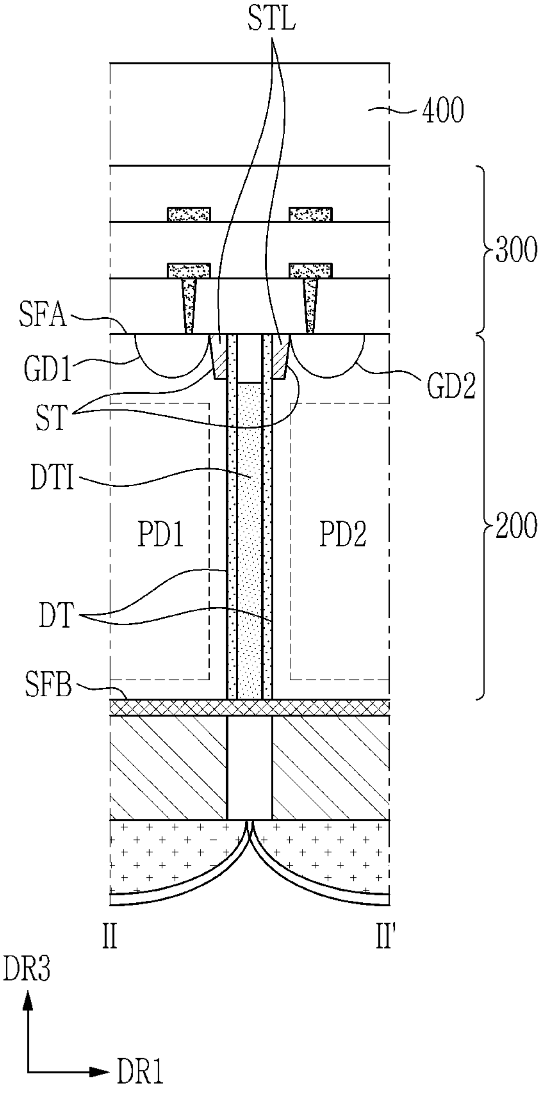
FIG. 5 is a cross-sectional view taken along a line II-II' of FIG. 3.
Figure 6:
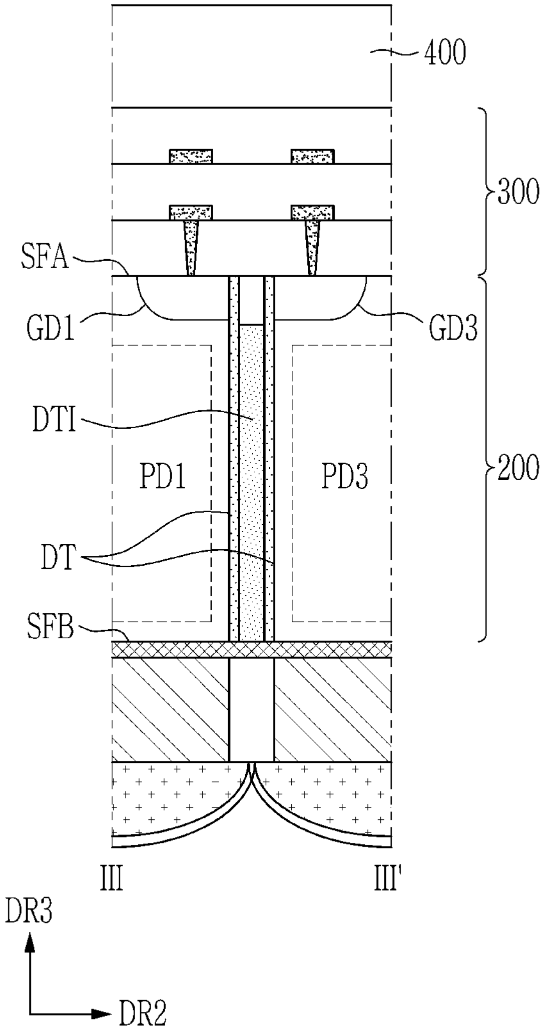
FIG. 6 is a cross-sectional view taken along a line III-III' of FIG. 3.

Then, the image sensor according to one or more embodiments will be described with reference to FIGS. 2 to 6. FIG. 2 is a plane view schematically showing the image sensor according to one or more embodiments, FIG. 3 is an enlarged view of a portion of FIG. 2, FIG. 4 is a cross-sectional view taken along a line I-I' of FIG. 2, FIG. 5 is a cross-sectional view taken along a line II-II' of FIG. 3, and FIG. 6 is a cross-sectional view taken along a line III-III' of FIG. 3.

Referring to FIG. 2, the image sensor 100, according to one or more embodiments, may include the plurality of pixels P1, P2, P3, and P4. As understood by one of ordinary skill in the art, the number of pixels illustrated in FIG. 2 is merely an example, and the image sensor 100 may include any desired number of pixels. The plurality of pixels P1, P2, P3, and P4 may include the first pixel P1, the second pixel P2, the third pixel P3, and the fourth pixel P4 adjacent to each other along a first direction DR1 and a second direction DR2 different from the first direction DR1. In one or more examples, the first direction DR1 and the second direction DR2 may be orthogonal to each other.

The first pixel P1 and the second pixel P2 may be disposed adjacent to each other and the third pixel P3 and the fourth pixel P4 may be disposed adjacent to each other along the first direction DR1 on a plane formed by the first direction DR1 and the second direction DR2. In addition, the first pixel P1 and the third pixel P3 may be disposed adjacent to each other and the second pixel P2 and the fourth pixel P4 may be disposed adjacent to each other along the second direction DR2 on the plane formed by the first direction DR1 and the second direction DR2.

The plurality of pixels P1, P2, P3, and P4 may be divided by a pixel separation structure (or a pixel isolation structure) DTI. The pixel separation structure DTI illustrated in FIG. 2 may be composed of individual pieces that are connected to each other to be disposed to surround the first pixel P1, the second pixel P2, the third pixel P3, and the fourth pixel P4.

The pixel separation structure DTI may prevent crosstalk between the plurality of pixels P1, P2, P3, and P4. As understood by one of ordinary skill in the art, crosstalk may occur when signals from one pixel interfere with signals from another pixel.

The pixel separation structure DTI may be disposed within a deep trench DT, and at least a portion of the deep trench DT may be surrounded by an element separation film STL disposed within a shallow trench ST.

Each of the plurality of pixels P1, P2, P3, and P4 may include a plurality of gates TG, SF, SG, and RG. The plurality of gates TG, SF, SG, and RG may include the transmission gate TG, the drive gate SF, the selection gate SG, and the reset gate RG.

The plurality of pixels P1, P2, P3, and P4 may include a first ground region GD1 disposed at the first pixel P1, a second ground region GD2 disposed at the second pixel P2, a third ground region GD3 disposed at the third pixel P3, and a fourth ground region GD4 disposed at the fourth pixel P4.

The first ground region GD1, the second ground region GD2, the third ground region GD3, and the fourth ground region GD4 of the plurality of pixels P1, P2, P3, and P4 may be connected to each other.

In one or more embodiments, the plurality of gates TG, SF, SG, and RG and the first ground region GD1 of the first pixel P1 and the plurality of gates TG, SF, SG, and RG and the second ground region GD2 of the second pixel P2 may be symmetric with respect to a first line IML1 parallel to the second direction DR2. In one or more embodiments, the plurality of gates TG, SF, SG, and RG and the third ground region GD3 of the third pixel P3 and the plurality of gates TG, SF, SG, and RG and the fourth ground region GD4 of the fourth pixel P4 may be symmetric with respect to the first line IML1.

In addition, in one or more embodiments, the plurality of gates TG, SF, SG, and RG and the first ground region GD1 of the first pixel P1 and the plurality of gates TG, SF, SG, and RG and the third ground region GD3 of the third pixel P3 may be symmetric with respect to a second line IML2 parallel to the first direction DR1. In one or more embodiments, the plurality of gates TG, SF, SG, and RG and the second ground region GD2 of the second pixel P2 and the plurality of gates TG, SF, SG, and RG and the fourth ground region GD4 of the fourth pixel P4 may be symmetric with respect to the second line IML2.

Referring to FIG. 3, on the plane formed by the first direction DR1 and the second direction DR2, a plurality of ground regions GD1, GD2, GD3, and GD4 may be disposed adjacent to a central portion CP of a region including the first pixel P1, the second pixel P2, the third pixel P3, and the fourth pixel P4. The plurality of ground regions GD1, GD2, GD3, and GD4 of the plurality of pixels P1, P2, P3, and P4 may be disposed to be adjacent to each other along the first direction DR1 and the second direction DR2.

In one or more embodiments, the pixel separation structure DTI disposed within a deep trench DT and element separation film STL, that is disposed at an outer edge of the pixel separation structure DTI and is disposed within the shallow trench ST, may be disposed between the first ground region GD1 of the first pixel P1 and the second ground region GD2 of the second pixel P2 adjacent along the first direction DR1 on the plane formed by the first direction DR1 and the second direction DR2. In one or more examples, the pixel separation structure DTI disposed within the deep trench DT and the element separation film STL, that is disposed at an outer edge of the pixel separation structure DTI and is disposed within the shallow trench ST, may be disposed between the third ground region GD3 of the third pixel P3 and the fourth ground region GD4 of the fourth pixel P4 adjacent along the first direction DR1 on the plane formed by the first direction DR1 and the second direction DR2. More specifically, in one or more examples, the first ground region GD1 of the first pixel P1 and the second ground region GD2 of the second pixel P2, adjacent along the first direction DR1, may contact the element separation film STL that is disposed at an outer edge of the pixel separation structure DTI and is disposed within the shallow trench ST so that the first ground region GD1 of the first pixel P1 and the second ground region GD2 of the second pixel P2 are separated and divided by the pixel separation structure DTI and the element separation film STL. In one or more examples, the third ground region GD3 of the third pixel P3 and the fourth ground region GD4 of the fourth pixel P4 adjacent along the first direction DR1 may contact the element separation film STL that is disposed at an outer edge of the pixel separation structure DTI and is disposed within the shallow trench ST so that the third ground region GD3 of the third pixel P3 and the fourth ground region GD4 of the fourth pixel P4 are separated and divided by the pixel separation structure DTI and the element separation film STL.

In one or more examples, the pixel separation structure DTI disposed within the deep trench DT may also be disposed between the first ground region GD1 of the first pixel P1 and the third ground region GD3 of the third pixel P3 adjacent along the second direction DR2 on the plane formed by the first direction DR1 and the second direction DR2. In one or more examples, the pixel separation structure DTI disposed within the deep trench DT may be disposed between the second ground region GD2 of the second pixel P2 and the fourth ground region GD4 of the fourth pixel P4 adjacent along the second direction DR2 on the plane formed by the first direction DR1 and the second direction DR2. More specifically, the first ground region GD1 of the first pixel P1 and the third ground region GD3 of the third pixel P3 adjacent along the second direction DR2 may directly contact the pixel separation structure DTI so that the first ground region GD1 of the first pixel P1 and the third ground region GD3 of the third pixel P3 are separated and divided by the pixel separation structure DTI. In one or more examples, the second ground region GD2 of the second pixel P2 and the fourth ground region GD4 of the fourth pixel P4 may directly contact the pixel separation structure DTI so that the second ground region GD2 of the second pixel P2 and the fourth ground region GD4 of the fourth pixel P4 are separated and divided by the pixel separation structure DTI.

FIG. 3 illustrates a first distance D1 between the first ground region GD1 of the first pixel P1 and the second ground region GD2 of the second pixel P2 adjacent along the first direction DR1 separated and divided by the pixel separation structure DTI and the element separation film STL. FIG. 3 further illustrates the first distance D1 between the third ground region GD3 of the third pixel P3 and the fourth ground region GD4 of the fourth pixel P4 adjacent along the first direction DR1 on the plane formed by the first direction DR1 and the second direction DR2. FIG. 3 further illustrates a second distance D2 between the first ground region GD1 of the first pixel P1 and the third ground region GD3 of the third pixel P3 adjacent along the second direction DR2 divided by the pixel separation structure DTI disposed within the deep trench DT. FIG. 3 further illustrates the second distance D2 between the second ground region GD2 of the second pixel P2 and the fourth ground region GD4 of the fourth pixel P4 adjacent along the second direction DR2 on the plane formed by the first direction DR1 and the second direction DR2. In one or more examples, the first distance D1 may be wider than the second distance D2.

The third ground region GD3 of the third pixel P3 and the fourth ground region GD4 of the fourth pixel P4 may contact the element separation film STL that is disposed at an outer edge of the pixel separation structure DTI and is disposed within the shallow trench ST so that the third ground region GD3 of the third pixel P3 and the fourth ground region GD4 of the fourth pixel P4 are separated and divided by the pixel separation structure DTI and the element separation film STL.

A majority of the pixel separation structure DTI disposed within the deep trench DT may be surrounded by the shallow trench ST and the element separation film STL disposed within the shallow trench ST. However, the shallow trench ST and the element separation film STL disposed within the shallow trench ST may not be disposed between two ground regions GD1 and GD3 adjacent to each other and two ground regions GD2 and GD4 adjacent to each other.

The image sensor 100 according to one or more embodiments will be described in more detail with reference to FIGS. 4 to 6 together with FIGS. 2 and 3.

The image sensor 100 may include a substrate 200. The substrate 200 may include silicon (Si), germanium (Ge), or silicon (Si)-germanium (Ge). The substrate 200 may include gallium arsenic (GaAs), indium phosphorus (InP), gallium phosphorus (GaP), indium arsenic (InAs), indium antimony (InSb), or indium gallium arsenic (InGaAs). The substrate 200 may include zinc telluride (ZnTe) or cadmium sulfide (CdS).

The substrate 200 may include bulk silicon or silicon-on-insulator (SOI). The substrate 200 may be a silicon substrate, or may include another material (for example, silicon germanium, indium antimonide, a lead tellurium compound, indium arsenic, indium phosphide, gallium arsenic, or gallium antimonide). In one or more examples, the substrate 200 may be a substrate in which an epitaxial layer is formed on a base substrate.

The substrate 200 may include a first surface SFA and a second surface SFB facing each other. The substrate 200 may include the deep trench DT, and the pixel separation structure DTI may be disposed within the deep trench DT of the substrate 200. As described above, the pixel separation structure DTI may surround the pixels P1, P2, P3, and P4 and the pixels P1, P2, P3, and P4 may be divided by the pixel separation structure DTI.

The pixel separation structure DTI may include an insulating pattern DTI1, a conductive pattern DTI2, and a capping pattern DTI3. The insulating pattern DTI1 may cover an inner sidewall of the deep trench DT. The capping pattern DTI3 may fill an upper portion of the deep trench DT. The conductive pattern DTI2 may fill a lower portion of the deep trench DT. An upper surface of the capping pattern DTI3 may be coplanar with the first surface SFA of the substrate 200, and a lower surface of the conductive pattern DTI2 may be coplanar with the second surface SFB of the substrate 200. The insulating pattern DTI1 may extend from the first surface SFA of the substrate 200 to the second surface SFB of the substrate 200. The conductive pattern DTI2 may be separated from substrate 200 by the insulating pattern DTI1. In one or more embodiments, the capping pattern DTI3 may be omitted.

The conductive pattern DTI2 may include a semiconductor material such as n-type or p-type doped polysilicon or a metal material. Each of the insulating pattern DTI1 and the capping pattern DTI3 may include a silicon oxide, a silicon nitride, or a silicon oxynitride. The insulating pattern DTI1 may include a metal oxide such as a hafnium oxide, an aluminum oxide, a tantalum oxide, or any other suitable oxide known to one of ordinary skill in the art. In one or more examples, the insulating pattern DTI1 may act as a negative fixed charge layer. As understood by one of ordinary skill in the art, a negative fixed charge layer may be a layer that is negatively charged.

Photoelectric conversion regions PD1, PD2, PD3, and PD4 corresponding to the pixels P1, P2, P3, and P4, respectively, may be disposed within the substrate 200. Light incident from the outside may be converted to electrical signals in the photoelectric conversion regions PD1, PD2, PD3, and PD4. Each of the photoelectric conversion regions PD1, PD2, PD3, and PD4 may include a photodiode formed inside the substrate 200. The photoelectric conversion regions PD1, PD2, PD3, and PD4 may be doped with a conductive impurity different from a conductive impurity doped on the substrate 200.

The pixel separation structure DTI may be disposed between the photoelectric conversion regions PD1, PD2, PD3, and PD4 corresponding to the plurality of pixels P1, P2, P3, and P4, respectively, so that the photoelectric conversion regions PD1, PD2, PD3, and PD4 are separated from each other by the pixel separation structure DTI. The pixel separation structure DTI may electrically and optically isolate the photoelectric conversion regions PD1, PD2, PD3, and PD4.

The substrate 200 may include the shallow trench ST, and the element separation film STL may be disposed within the shallow trench ST of the substrate 200. The shallow trench ST may be disposed at a portion of the substrate 200 without penetrating the substrate 200 from the first surface SFA of the substrate 200.

A depth of the shallow trench ST may be smaller than a depth of the deep trench DT along a height direction DR3.

The element separation film STL may surround a portion of the pixel separation structure DTI. An upper surface of the element separation film STL may be coplanar with the first surface SFA of the substrate 200. The element separation film STL may include a silicon oxide, a silicon nitride, or a combination thereof.

The plurality of gates TG, SF, SG, and RG may be disposed at the first surface SFA of the substrate 200.

A plurality of floating diffusion regions FD and the plurality of ground regions GD1, GD2, GD3, and GD4 may be disposed adjacent to the first surface SFA of the substrate 200. The plurality of floating diffusion regions FD and the plurality of ground regions GD1, GD2, GD3, and GD4 may be spaced apart from the photoelectric conversion regions PD1, PD2, PD3, and PD4 along a third direction DR3 that is the height direction.

The plurality of floating diffusion regions FD may be adjacent to each transfer gate TG. The plurality of floating diffusion regions FD may have a conductivity type opposite to that of the substrate 200.

The plurality of ground regions GD1, GD2, GD3, and GD4 may be disposed adjacent to the central portion CP of the region including the first pixel P1, the second pixel P2, the third pixel P3, and the fourth pixel P4.

The plurality of ground regions GD1, GD2, GD3, and GD4 may be doped with the same conductive impurity as a conductive impurity doped on the substrate 200, and a concentration of the conductive impurity doped on the plurality of ground regions GD1, GD2, GD3, and GD4 may be higher than a concentration of the conductive impurity doped on the substrate 200.

In one or more examples, the substrate 200 may further include a plurality of impurity regions disposed adjacent to the first surface SFA, and the plurality of impurity regions may be an active region for an operation of a transistor.

The plurality of ground regions GD1, GD2, GD3, and GD4, the plurality of gates TG, SF, SG, and RG, and the floating diffusion region FD form a transmission transistor, a drive transistor, a selection transistor, and a reset transistor. The plurality of ground regions GD1, GD2, GD3, and GD4 may be a ground pattern for grounding at least one of the transmission transistor, the drive transistor, the selection transistor, and the reset transistor.

A first structure 300 may be disposed on the first surface SFA of the substrate 200. The first structure 300 may include a plurality of vias ML1, a plurality of wiring layers ML2 and ML3, and a plurality of insulating layers IL1, IL2, and IL3. The plurality of insulating layers IL1, IL2, and IL3 may electrically separate the plurality of vias ML1 and the plurality of wiring layers ML2 and ML3.

The plurality of vias ML1 and the plurality of wiring layers ML2 and ML3 may be electrically connected to transistors on the first surface SFA of the substrate 200.

The plurality of vias ML1 and the plurality of wiring layers ML2 and ML3 may include tungsten, aluminum, copper, tungsten silicide, titanium silicide, tungsten nitride, titanium nitride, doped polysilicon, or any other suitable material known to one of ordinary skill in the art.

The plurality of insulating layers IL1, IL2, and IL3 may include an insulating material such as a silicon oxide, a silicon nitride, a silicon oxynitride, a low dielectric material (or a low-k material), or any other suitable material known to one of ordinary skill in the art. For example, the low dielectric material may include at least one of flowable oxide (FOX), torene silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organosilicate glass (OSG), parylene, bis-benzocyclobutenes (BCB), SiLK, polyimide, a porous polymeric material, and a combination thereof.

The image sensor 100 may further include a support substrate 400 disposed on the first structure 300. As understood by one of ordinary skill in the art, the support substrate 400 may be omitted. An adhesive member may be further disposed between the support substrate 400 and the first structure 300.

A reflection prevention layer (or an antireflection layer) PRL may be disposed at the second surface SFB of the substrate 200. The reflection prevention layer PRL may cover the second surface SFB of the substrate 200 and the pixel separation structure DTI.

The reflection prevention layer PRL may include hafnium oxide ($HfO_2$), silicon oxide ($SiO_2$), silicon nitride (SiN), aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), thulium oxide ($Tm_2O_3$), ytterbium oxide ($Yb_2O_3$), lutetium oxide ($Lu_2O_3$), yttrium oxide ($Y_2O_3$), or a combination thereof.

In one or more embodiments, the reflection prevention layer PRL may include a plurality of layers including different materials and having different thicknesses. For example, the reflection prevention layer PRL may include first to third reflection prevention layers sequentially stacked on the second surface SFB of the substrate 200.

The first reflection prevention layer may be a fixed charge layer having a negative fixed charge. Hole accumulation may occur around the fixed charge layer so that dark current and white spot are effectively reduced.

The third reflection prevention layer may include a metal oxide or a metal fluoride including at least one of hafnium (Hf), zirconium (Zr), aluminum (Al), tantalum (Ta), titanium (Ti), and yttrium (Y). For example, the first reflection prevention layer and the third reflection prevention layer may include a hafnium oxide layer, and the second reflection prevention layer may include a silicon oxide and/or a silicon nitride. However, in one or more embodiments, the number and a relative thickness of layers constituting the reflection prevention layer PRL may be variously modified.

In addition, in one or more embodiments, the reflection prevention layer PRL may further include a silicon nitride layer disposed between the second reflection prevention layer and the third reflection prevention layer.

Fence patterns IS may be disposed below the reflection prevention layer PRL. On the plane formed by the first direction DR1 and the second direction DR2, the fence patterns IS may extend along a portion of the pixel separation structure DTI, and the portion of the pixel separation structure DTI may overlap the fence patterns IS along the third direction DR3 that is the height direction.

The fence patterns IS may surround color filters CF.

The fence patterns IS may include a low refractive index material. The low refractive index material may have a refractive index greater than about 1.0 and less than or equal to about 1.4. For example, the low refractive index material may include polymethylmethacrylate (PMMA), silicon acrylate, cellulose acetatebutyrate (CAB), silica, or fluorosilicon acrylate (FSA). For example, the low refractive index material may include a polymer material in which silica (SiOx) particles are dispersed.

When the fence patterns IS include a low refractive index material having a relatively low refractive index, light incident toward the fence patterns IS may be totally reflected to be directed toward a central portion CP of each of the pixel regions P1, P2, P3, and P4.

The fence patterns IS may prevent light obliquely incident into the color filter CF disposed in one of the pixel regions P1, P2, P3, and P4 from entering the color filter CF disposed above another pixel region adjacent to the one of the pixel regions P1, P2, P3, and P4 so that crosstalk between the plurality of pixel regions P1 to P4 is prevented.

The plurality of color filters CF may be disposed on the reflection prevention layer PRL, and may be separated from each other by the fence pattern IS. For example, the plurality of color filters CF may include a green filter, a blue filter, and a red filter. For example, the plurality of color filters CF may include a cyan filter, a magenta filter, and a yellow filter.

A micro lens ML may be disposed on the color filter CF and the fence pattern IS. On the plane formed by the first direction DR1 and the second direction DR2, the micro lens ML may be disposed to correspond to each of the pixel regions P1, P2, P3, and P4.

The micro lens ML may be transparent. For example, the micro lens ML may be formed of a resin-based material such as a styrene-based resin, an acryl-based resin, a styrene-acryl copolymer resin, a siloxane-based resin, or any other suitable resin known to one of ordinary skill in the art.

The micro lens ML may concentrate incident light, and the concentrated light may be incident to the photoelectric conversion regions PD1, PD2, PD3, and PD4 through the color filter CF.

A capping layer CPL may be disposed on the micro lens ML to protect the micro lens ML.

Referring to FIG. 5 together with FIG. 3, the pixel separation structure DTI disposed within the deep trench DT and the element separation film STL that is disposed at an outer edge of the pixel separation structure DTI and is disposed within the shallow trench ST may be disposed between the first ground region GD1 of the first pixel P1 and the second ground region GD2 of the second pixel P2 adjacent along the first direction DR1. Thus, a first edge EG11 of the first ground region GD1 of the first pixel P1 and a first edge EG21 of the second ground region GD2 of the second pixel P2 that are adjacent to each other along the first direction DR1 and are parallel to the second direction DR2 may contact the element separation film STL that is disposed within the shallow trench ST. Furthermore, the first ground region GD1 of the first pixel P1 and the second ground region GD2 of the second pixel P2 may be separated and divided by the pixel separation structure DTI and the element separation film STL.

In one or more examples, the pixel separation structure DTI disposed within the deep trench DT and the element separation film STL that is disposed at an outer edge of the pixel separation structure DTI and is disposed within the shallow trench ST may be disposed between the third ground region GD3 of the third pixel P3 and the fourth ground region GD4 of the fourth pixel P4 adjacent along the first direction DR1. A first edge EG31 of the third ground region GD3 of the third pixel P3 and a first edge EG41 of the fourth ground region GD4 of the fourth pixel P4 that are adjacent to each other along the first direction DR1 and are parallel to the second direction DR2 may contact the element separation film STL so that the third ground region GD3 of the third pixel P3 and the fourth ground region GD4 of the fourth pixel P4 are separated and divided by the pixel separation structure DTI and the element separation film STL.

Referring to FIG. 6 together with FIG. 3, the pixel separation structure DTI disposed within the deep trench DT may be disposed between the first ground region GD1 of the first pixel P1 and the third ground region GD3 of the third pixel P3 adjacent along the second direction DR2, and a second edge EG12 of the first ground region GD1 of the first pixel P1 and a second edge EG32 of the third ground region GD3 of the third pixel P3 that are adjacent along the second direction DR2 and are parallel to the first direction DR1 may directly contact the pixel separation structure DTI so that the first ground region GD1 of the first pixel P1 and the third ground region GD3 of the third pixel P3 are separated and divided by the pixel separation structure DTI.

In one or more examples, the pixel separation structure DTI disposed within the deep trench DT may be disposed between the second ground region GD2 of the second pixel P2 and the fourth ground region GD4 of the fourth pixel P4 adjacent along the second direction DR2, and a second edge EG22 of the second ground region GD2 of the second pixel P2 and a second edge EG42 of the fourth ground region GD4 of the fourth pixel P4 that are adjacent along the second direction DR2 and are parallel to the first direction DR1 may directly contact the pixel separation structure DTI so that the second ground region GD2 of the second pixel P2 and the fourth ground region GD4 of the fourth pixel P4 are separated and divided by the pixel separation structure DTI.

Referring to FIGS. 5 and 6, a depth of the second edge EG12 of the first ground region GD1 of the first pixel P1 directly contacting the pixel separation structure DTI and parallel to the first direction DR1 and a depth of the second edge EG32 of the third ground region GD3 of the third pixel P3 directly contacting the pixel separation structure DTI and parallel to the first direction DR1 may be greater than a depth of the first edge EG11 of the first ground region GD1 of the first pixel P1 contacting the element separation film STL and parallel to the second direction DR2 and a depth of the first edge EG21 of the second ground region GD2 of the second pixel P2 contacting the element separation film STL and parallel to the second direction DR2.

In one or more examples, a depth of the second edge EG22 of the second ground region GD2 of the second pixel P2 directly contacting the pixel separation structure DTI and parallel to the first direction DR1, and a depth of the second edge EG42 of the fourth ground region GD4 of the fourth pixel P4 directly contacting the pixel separation structure DTI and parallel to the first direction DR1, may be greater than a depth of the first edge EG31 of the third ground region GD3 of the third pixel P3 contacting the element separation film STL and parallel to the second direction DR2, and a depth of the first edge EG41 of the fourth ground region GD4 of the fourth pixel P4 contacting the element separation film STL and parallel to the second direction DR2.

As the pixels P1, P2, P3, and P4 of the image sensor 100 are down-sized, sizes of the plurality of ground regions GD1, GD2, GD3, and GD4 also decrease. In addition, a ratio of a depth to a width of the pixel separation structure DTI for separating and dividing the plurality of ground regions GD1, GD2, GD3, and GD4 from each other may increase, and a ratio of a depth to a width of the deep trench DT where the pixel separation structure DTI is disposed may increase.

If a width of an inlet portion of the deep trench DT formed close to the first surface SFA of the substrate 200 is smaller than a width of an inner portion of the deep trench DT formed inside the substrate 200 as the ratio of the depth to the width of the deep trench DT increases, it may be difficult to uniformly form the pixel separation structure DTI formed inside the deep trench DT so that a void occurs in the pixel separation structure DTI disposed within the deep trench DT and the void results in performance degradation of the image sensor 100.

In contrast, when the deep trench DT is formed at a region surrounded by the shallow trench ST, the width of the inlet portion of the deep trench DT formed close to the first surface SFA of the substrate 200 may be formed wider than the width of the inner portion of the deep trench DT formed inside the substrate 200 so that the void is prevented from occurring in the pixel separation structure DTI disposed within the deep trench DT. However, when adjacent elements are separated from each other by not only the pixel separation structure DTI disposed within the deep trench DT but also the element separation film STL that is disposed at an outer edge of the deep trench DT and is disposed within the shallow trench ST, a distance between the adjacent elements may be relatively widened on the plane formed by the first direction DR1 and the second direction DR2, thereby making it difficult to meet a need for increasing a degree of integration of the elements.

According to one or more embodiments, the plurality of ground regions GD1, GD2, GD3, and GD4 may be disposed adjacent to the central portion CP of the region including the first pixel P1, the second pixel P2, the third pixel P3, and the fourth pixel P4 so that a size of an entire region where the plurality of ground regions GD1, GD2, GD3, and GD4 of the plurality of pixels P1, P2, P3, and P4, respectively, are formed is reduced. According to one or more embodiments, the pixel separation structure DTI and the element separation film STL may be disposed between two ground regions GD1 and GD2 of two pixels P1 and P2 adjacent to each other along the first direction DR1 and two ground regions GD3 and GD4 of two pixels P3 and P4 adjacent to each other along the first direction DR1. However, only the pixel separation structure DTI may be disposed between two ground regions GD1 and GD3 of two pixels P1 and P3 adjacent to each other along the second direction DR2 and two ground regions GD2 and GD4 of two pixels P2 and P4 adjacent to each other along the second direction DR2. Thus, some of adjacent ground regions of the plurality of ground regions GD1, GD2, GD3, and GD4 may be divided by the pixel separation structure DTI disposed within the deep trench DT and the element separation film STL disposed within the shallow trench ST so that the void, or any other similar structure, is prevented from occurring in the pixel separation structure DTI disposed within the deep trench DT. Furthermore, one or more adjacent ground regions of the plurality of ground regions GD1, GD2, GD3, and GD4 may be divided only by the pixel separation structure DTI disposed within the deep trench DT so that a degree of integration of the elements is increased by reducing a plane area of a region where the plurality of ground regions GD1, GD2, GD3, and GD4 are formed.

Figure 7:
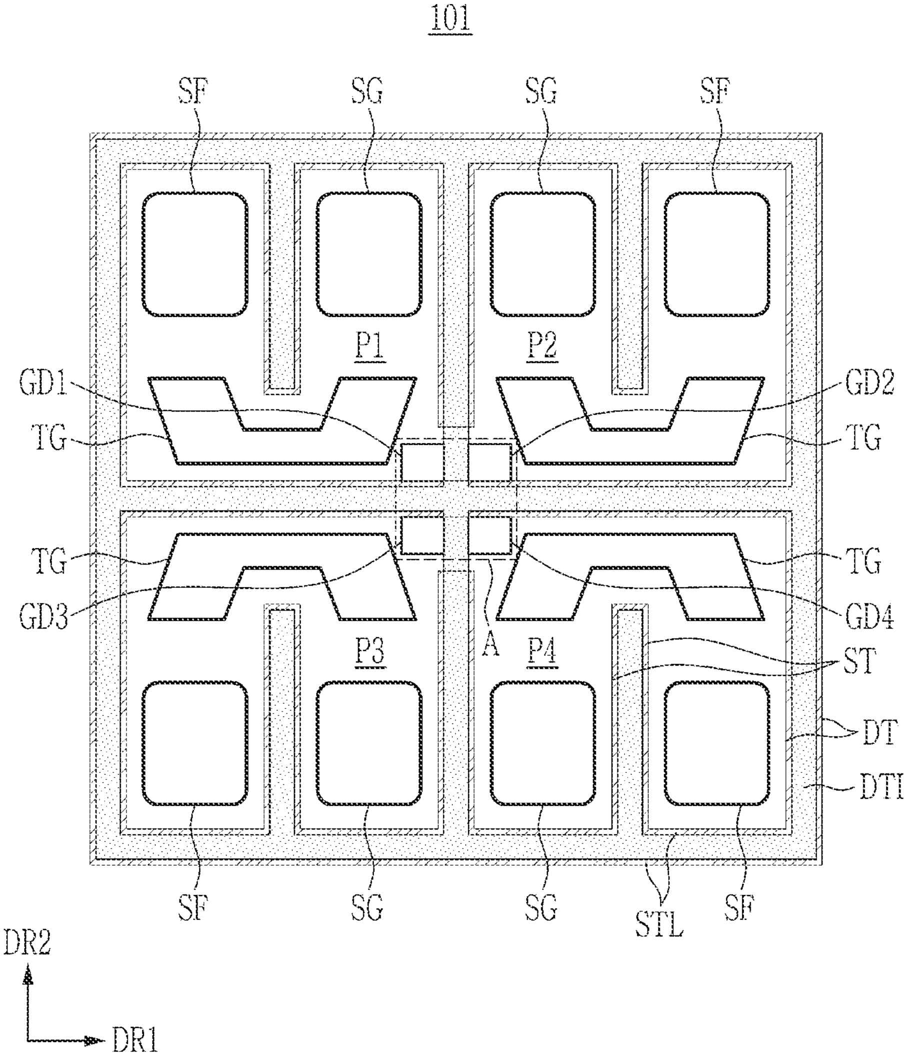
FIG. 7 is a plane view schematically showing an image sensor according to one or more embodiments.

An image sensor 101 according to one or more embodiments will be described with reference to FIGS. 7 and 8. FIG. 7 is a plane view schematically showing the image sensor according to the other embodiment, and FIG. 8 is an enlarged view of a portion of FIG. 7.

Figure 8:
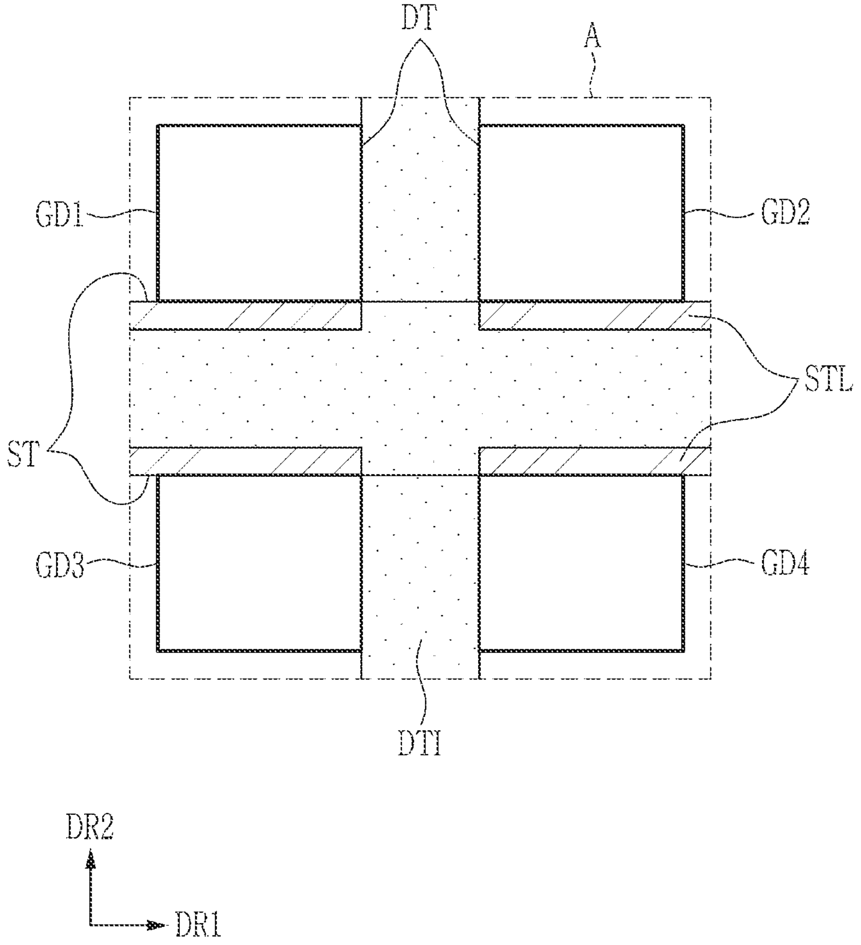
FIG. 8 is an enlarged view of a portion of FIG. 7.

Referring to FIGS. 7 and 8, the image sensor 101 according to the present embodiment is similar to the image sensor 100 according to one or more embodiments described above. A detailed description of same components is omitted.

The image sensor 101, according to the present embodiment, may include the plurality of pixels P1, P2, P3, and P4 including the first pixel P1, the second pixel P2, the third pixel P3, and the fourth pixel P4 adjacent to each other along the first direction DR1 and the second direction DR2, and the plurality of pixels P1, P2, P3, and P4 may be divided by the pixel separation structure DTI.

Each of the plurality of pixels P1, P2, P3, and P4 may include the plurality of gates TG, SF, SG, and RG.

The plurality of pixels P1, P2, P3, and P4 may include the first ground region GD1 disposed at the first pixel P1, the second ground region GD2 disposed at the second pixel P2, the third ground region GD3 disposed at the third pixel P3, and the fourth ground region GD4 disposed at the fourth pixel P4.

The first ground region GD1, the second ground region GD2, the third ground region GD3, and the fourth ground region GD4 of the plurality of pixels P1, P2, P3, and P4, respectively, may be connected to each other.

The plurality of ground regions GD1, GD2, GD3, and GD4 of the plurality of pixels P1, P2, P3, and P4, respectively, may be disposed to be adjacent to each other along the first direction DR1 and the second direction DR2.

Unlike the image sensor 100 according to one or more embodiments described above, according to the image sensor 101, according to the present embodiment, the pixel separation structure DTI disposed within the deep trench DT may be disposed between the first ground region GD1 of the first pixel P1 and the second ground region GD2 of the second pixel P2 adjacent along the first direction DR1 and between the third ground region GD3 of the third pixel P3 and the fourth ground region GD4 of the fourth pixel P4 adjacent along the first direction DR1. As a result of this configuration, the two ground regions GD1 and GD2 adjacent to each other along the first direction DR1 and two ground regions GD3 and GD4 adjacent to each other along the first direction DR1 are separated and divided by the pixel separation structure DTI.

In addition, the pixel separation structure DTI disposed within the deep trench DT and the element separation film STL, that is disposed at an outer edge of the pixel separation structure DTI and is disposed within the shallow trench ST, may be disposed between the first ground region GD1 of the first pixel P1 and the third ground region GD3 of the third pixel P3 adjacent along the second direction DR2 and between the second ground region GD2 of the second pixel P2 and the fourth ground region GD4 of the fourth pixel P4 adjacent along the second direction DR2. As a result of this configuration, two ground regions GD1 and GD3 adjacent to each other along the second direction DR2 and two ground regions GD2 and GD4 adjacent to each other along the second direction DR2 are separated and divided by the pixel separation structure DTI and the element separation film STL.

Thus, one or more of adjacent ground regions of the plurality of ground regions GD1, GD2, GD3, and GD4 may be divided by the pixel separation structure DTI disposed within the deep trench DT and the element separation film STL disposed within the shallow trench ST so that the void, or any other similar structure, is prevented from occurring in the pixel separation structure DTI disposed within the deep trench DT, and one or more of adjacent ground regions of the plurality of ground regions GD1, GD2, GD3, and GD4 may be divided only by the pixel separation structure DTI disposed within the deep trench DT so that a degree of integration of the elements is increased by reducing a plane area of a region where the plurality of ground regions GD1, GD2, GD3, and GD4 are formed.

Many features of the image sensor 100 according to one or more embodiments described above are all applicable to the image sensor 101 according to the present embodiment.

Figure 9:
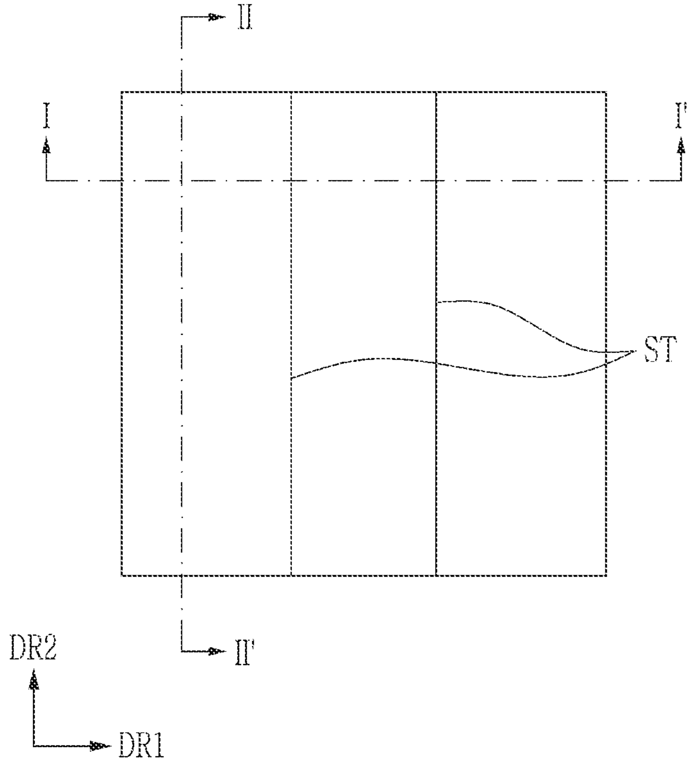
FIG. 9 is a plane view showing a manufacturing method of the image sensor according to one or more embodiments.
Figure 12:
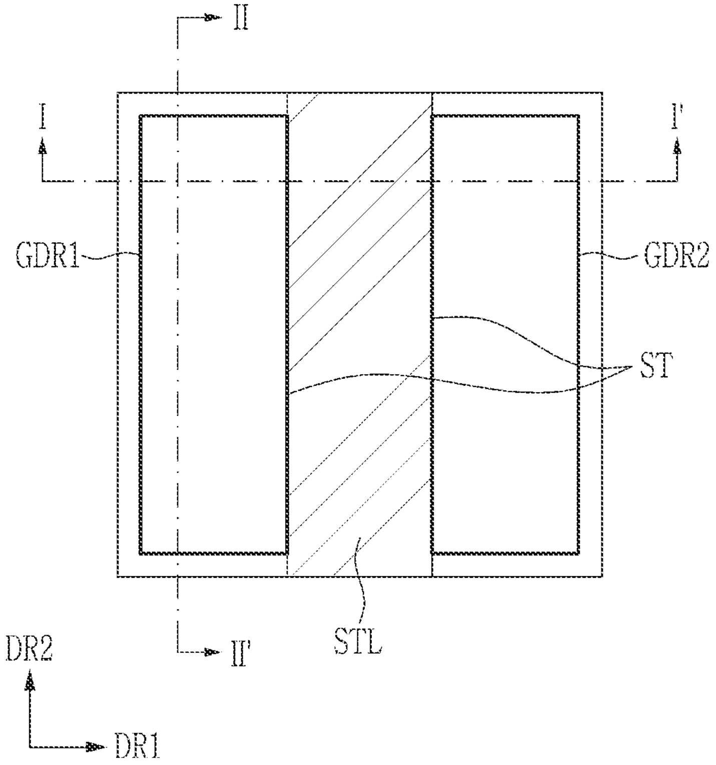
FIG. 12 is a plane view showing a manufacturing method of the image sensor according to one or more embodiments.
Figure 13:
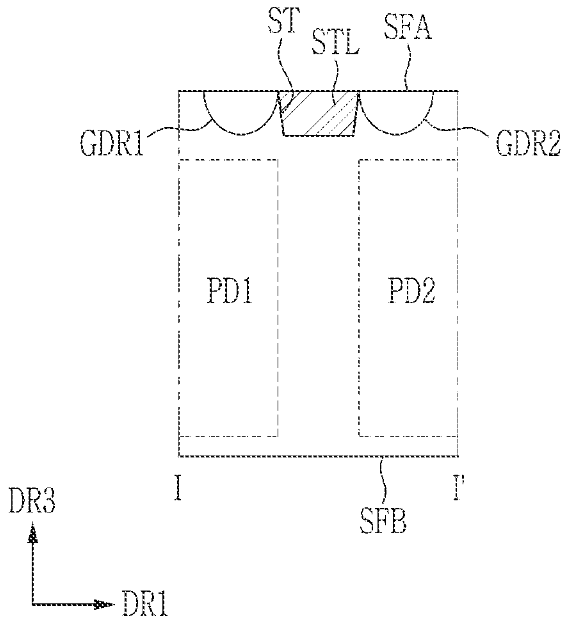
FIG. 13 is a cross-sectional view illustrating the manufacturing method of the image sensor according to one or more embodiments, and are cross-sectional views cut along lines I-I' of FIG. 12.
Figure 15:
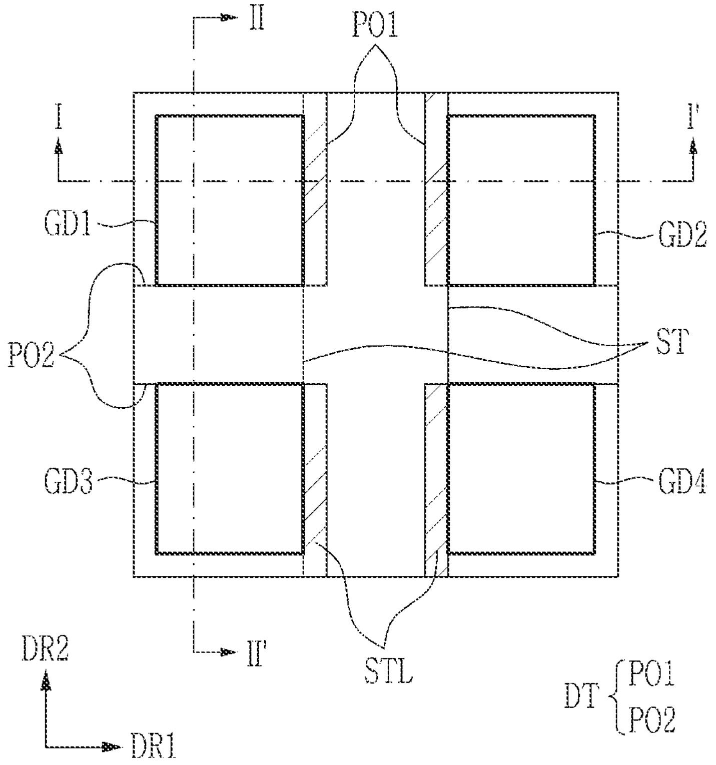
FIG. 15 is a plane view showing a manufacturing method of the image sensor according to one or more embodiments.
Figure 16:
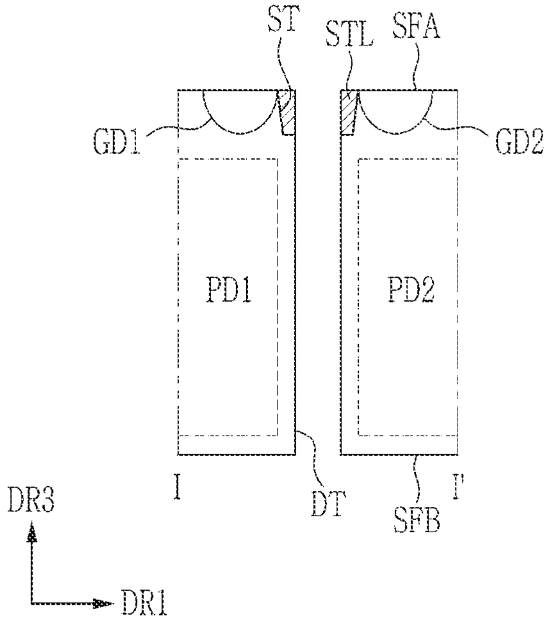
FIG. 16 is a cross-sectional view illustrating the manufacturing method of the image sensor according to one or more embodiments, and are cross-sectional views cut along lines I-I' of FIG. 15.

A manufacturing method of the image sensor according to one or more embodiments will be described with reference to FIGS. 9 to 17 together with FIGS. 2 to 6. FIGS. 9, 12, and 15 are plane views showing the manufacturing method of the image sensor according to one or more embodiments, FIGS. 10, 13, and 16 are cross-sectional views illustrating the manufacturing method of the image sensor according to one or more embodiments, and are cross-sectional views cut along lines I-I' of FIGS. 9, 12, and 15, and FIGS. 11, 14, and 17 are cross-sectional views illustrating the manufacturing method of the image sensor according to one or more embodiments, and are cross-sectional views cut along lines II-II' of FIGS. 9, 12, and 15.

Figure 10:
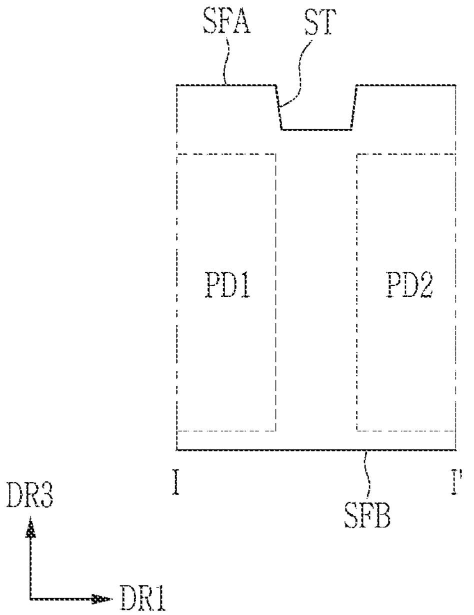
FIG. 10 is a cross-sectional view illustrating the manufacturing method of the image sensor according to one or more embodiments, and are cross-sectional views cut along lines I-I' of FIG. 9.
Figure 11:
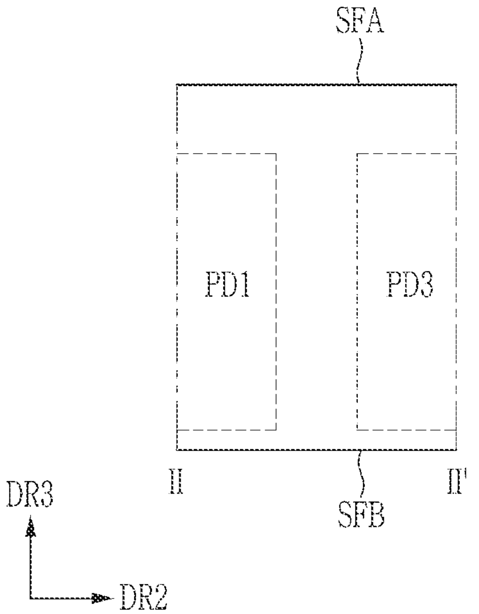
FIG. 11 is a cross-sectional view illustrating the manufacturing method of the image sensor according to one or more embodiments, and are cross-sectional views cut along lines II-II' of FIG. 9.

Referring to FIGS. 9 to 11, the shallow trench ST may be formed on the first surface SFA of the substrate 200.

The photoelectric conversion regions PD1, PD2, PD3, and PD4 corresponding to the pixels P1, P2, P3, and P4, respectively, may be formed within the substrate 200.

Referring to FIGS. 2 to 6 together with FIGS. 9 to 11, the shallow trench ST may be formed to mostly surround the plurality of pixels P1, P2, P3, and P4. However, the ST may not be formed between regions where the two adjacent ground regions GD1 and GD3 are to be formed and between regions where the two adjacent ground regions GD2 and GD4 are to be formed along the first direction DR1.

Within a region where the plurality of ground regions GD1, GD2, GD3, and GD4 are disposed, the shallow trench ST may be formed along a direction parallel to the second direction DR2, and may not be formed along a direction parallel to the first direction DR1.

Figure 14:
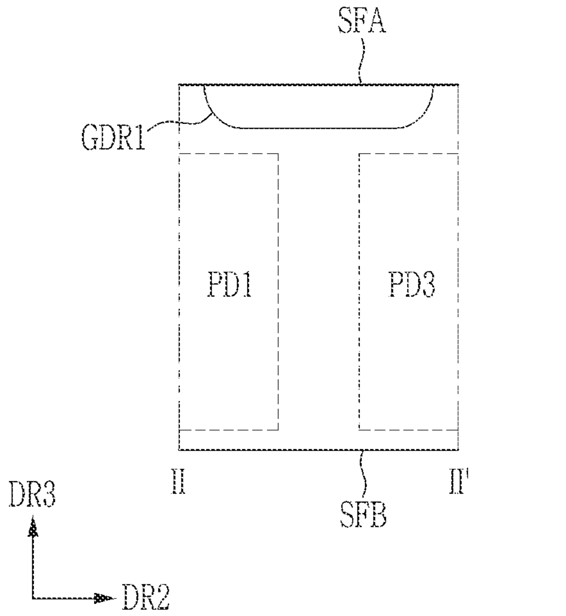
FIG. 14 is a cross-sectional view illustrating the manufacturing method of the image sensor according to one or more embodiments, and are cross-sectional views cut along lines II-II' of FIG. 12.

Referring to FIGS. 12 to 14, a first preliminary region GDR1 and a second preliminary region GDR2 may be formed at both sides of the shallow trench ST along a direction parallel to the second direction DR2, and the element separation film STL may be formed within the shallow trench ST.

In this case, the plurality of floating diffusion regions FD and the plurality of impurity regions may be formed.

The first preliminary region GDR1 and the second preliminary region GDR2 may be doped with the same conductive impurity as a conductive impurity doped on the substrate 200, and a concentration of the conductive impurity doped on the first preliminary region GDR1 and the second preliminary region GDR2 may be higher than a concentration of the conductive impurity doped on the substrate 200.

The element separation film STL may include a silicon oxide, a silicon nitride, or a combination thereof.

Depths of the first preliminary region GDR1 and the second preliminary region GDR2 may be deeper as the depths of the first preliminary region GDR1 and the second preliminary region GDR2 are closer to central portions of the first preliminary region GDR1 and the second preliminary region GDR2 along the first and second directions DR1 and DR2, and the depths of the first preliminary region GDR1 and the second preliminary region GDR2 may be shallower as the depths of the first preliminary region GDR1 and the second preliminary region GDR2 are closer to edges of the first preliminary region GDR1 and the second preliminary region GDR2 along the first and second directions DR1 and DR2.

The first preliminary region GDR1 and the second preliminary region GDR2 may be spaced apart from the photoelectric conversion regions PD1, PD2, PD3, and PD4 disposed within the substrate 200 along the third direction DR3 that is the height direction.

Figure 17:
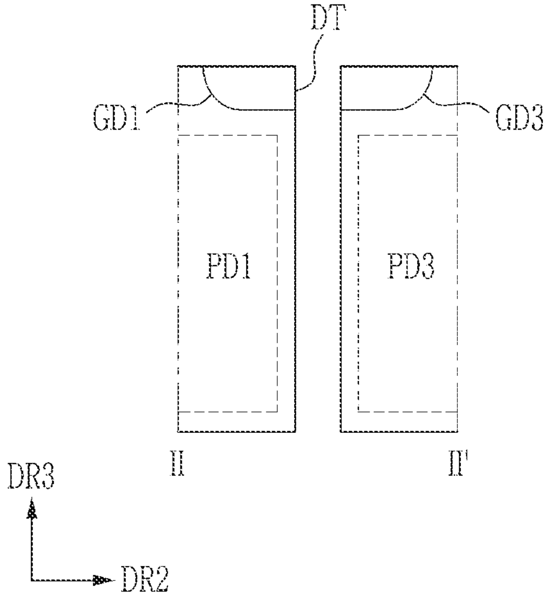
FIG. 17 is a cross-sectional view illustrating the manufacturing method of the image sensor according to one or more embodiments, and are cross-sectional views cut along lines II-II' of FIG. 15.

Referring to FIGS. 15 to 17 together with FIGS. 2 to 6, the deep trench DT may be formed to surround the plurality of pixels P1, P2, P3, and P4. Most of the deep trenches DT may be formed at the element separation film STL formed in the shallow trench ST and the substrate 200. Within a region where the plurality of ground regions GD1, GD2, GD3, and GD4 are disposed, the deep trench DT may overlap the shallow trench ST, and may be formed to include a first portion PO1 extending in a direction parallel to the second direction DR2 and a second portion PO2 that intersects the first portion PO1 and crosses the first preliminary region GDR1 and the second preliminary region GDR2.

However, as shown in FIGS. 9 to 11, the shallow trench ST may be formed along the direction parallel to the second direction DR2 and may not be formed along the direction parallel to the first direction DR1 within the region where the plurality of ground regions GD1, GD2, GD3, and GD4 are disposed. As shown in FIGS. 12 to 14, the first preliminary region GDR1 and the second preliminary region GDR2 may be formed at both sides of the shallow trench ST along the direction parallel to the second direction DR2. Accordingly, as shown in FIGS. 15 to 17, the deep trench DT may be formed to cross the first preliminary region GDR1 and the second preliminary region GDR2 along the direction parallel to the first direction DR1. Subsequently, as shown in FIGS. 2 to 6, the pixel separation structure DTI may be formed within the deep trench DT.

Thus, as shown in FIGS. 15 to 17, the deep trench DT may be formed to cross the first preliminary region GDR1 and the second preliminary region GDR2 along the direction parallel to the first direction DR1, and by the pixel separation structure DTI formed within the deep trench DT, the first preliminary region GDR1 may be divided into the first ground region GD1 of the first pixel P1 and the third ground region GD3 of the third pixel P3 and the second preliminary region GDR2 may be divided into the second ground region GD2 of the second pixel P2 and the fourth ground region GD4 of the fourth pixel P4.

As described with reference to FIGS. 5 and 6, the depth of the second edge EG12 of the first ground region GD1 of the first pixel P1 directly contacting the pixel separation structure DTI and parallel to the first direction DR1 and the depth of the second edge EG32 of the third ground region GD3 of the third pixel P3 directly contacting the pixel separation structure DTI and parallel to the first direction DR1 may be greater than the depth of the first edge EG11 of the first ground region GD1 of the first pixel P1 contacting the element separation film STL and parallel to the second direction DR2 and the depth of the first edge EG21 of the second ground region GD2 of the second pixel P2 contacting the element separation film STL and parallel to the second direction DR2.

In one or more examples, the depth of the second edge EG22 of the second ground region GD2 of the second pixel P2 directly contacting the pixel separation structure DTI and parallel to the first direction DR1 and the depth of the second edge EG42 of the fourth ground region GD4 of the fourth pixel P4 directly contacting the pixel separation structure DTI and parallel to the first direction DR1 may be greater than the depth of the first edge EG31 of the third ground region GD3 of the third pixel P3 contacting the element separation film STL and parallel to the second direction DR2 and the depth of the first edge EG41 of the fourth ground region GD4 of the fourth pixel P4 contacting the element separation film STL and parallel to the second direction DR2.

Subsequently, the plurality of gates TG, SF, SG, and RG may be formed at the first surface SFA of the substrate 200, the first structure 300 may be formed, and the reflection prevention layer PRL, the fence patterns IS, the color filters CF, the micro lens ML, and the capping layer CPL may be formed at the second surface SFB of the substrate 200 so that the image sensor 100 shown in FIGS. 2 to 6 is formed.

According to a manufacturing method of the image sensor according to one or more embodiments, the shallow trench ST may be formed along the direction parallel to the first direction DR1 and may not be formed along the direction parallel to the second direction DR2 within the region where the plurality of ground regions GD1, GD2, GD3, and GD4 are disposed.

In addition, the first preliminary region GDR1 and the second preliminary region GDR2 may be formed at both sides of the shallow trench ST along the direction parallel to the first direction DR1.

Within the region where the plurality of ground regions GD1, GD2, GD3, and GD4 are disposed, the deep trenches DT may be formed to cross each other in parallel with the first direction DR1 and the second direction DR2 and the deep trench DT may be formed to cross central portions of the first preliminary region GDR1 and the second preliminary region GDR2 along the direction parallel to the second direction DR2. By the pixel separation structure DTI formed within the deep trench DT, the first preliminary region GDR1 may be divided into the first ground region GD1 of the first pixel P1 and the second ground region GD2 of the second pixel P2 and the second preliminary region GDR2 may be divided into the third ground region GD3 of the third pixel P3 and the fourth ground region GD4 of the fourth pixel P4.

According to the manufacturing method of the image sensor according to one or more embodiments, the shallow trench ST may be formed in the direction parallel to the first direction DR1 or the second direction DR2 in a region where the plurality of ground regions GD1, GD2, GD3, and GD4 are to be disposed, the first preliminary region GDR1 and the second preliminary region GDR2 may be formed at both sides of the shallow trench ST in a direction parallel to the shallow trench ST, and each of the first preliminary region GDR1 and the second preliminary region GDR2 may be divided into two ground regions by the deep trench DT crossing the first preliminary region GDR1 and the second preliminary region GDR2 and extending along the inside of the shallow trench ST and the pixel separation structure DTI within the deep trench DT so that the plurality of ground regions GD1, GD2, GD3, and GD4 of the plurality of pixels P1, P2, P3, and P4 are formed.

Thus, some of adjacent ground regions of the plurality of ground regions GD1, GD2, GD3, and GD4 may be divided by the pixel separation structure DTI disposed within the deep trench DT and the element separation film STL disposed within the shallow trench ST so that the void or the like is prevented from occurring in the pixel separation structure DTI disposed within the deep trench DT, and some of adjacent ground regions of the plurality of ground regions GD1, GD2, GD3, and GD4 may be divided only by the pixel separation structure DTI disposed within the deep trench DT so that a degree of integration of the elements is increased by reducing a plane area of a region where the plurality of ground regions GD1, GD2, GD3, and GD4 are formed.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

DESCRIPTION OF SYMBOLS

P1, P2, P3, P4: pixel
GD1, GD2, GD3, GD4: ground region
TG, SF, SG, RG: gate
PD1, PD2, PD3, PD4: photoelectric conversion region
DT: deep trench
DTI: pixel separation structure
ST: shallow trench
STL: element separation film
FD: floating diffusion region
GDR1, GDR2: preliminary region
200: substrate

What is claimed is:

1. An image sensor comprising:
a substrate comprising:
a first surface;
a second surface facing the first surface; and
a plurality of pixel regions disposed along a first direction and a second direction different from the first direction; and
a plurality of ground regions that are disposed within a portion of the substrate along a depth direction perpendicular to the first direction and the second direction from the first surface of the substrate;
a deep trench that extends from the first surface of the substrate to the second surface of the substrate and defines the plurality of pixel regions within the substrate; and
a shallow trench that extends into the portion of the substrate along the depth direction from the first surface of the substrate and is disposed at an outer edge of at least a portion of the deep trench, the shallow trench having a depth that is less than a depth of the deep trench;
wherein on a plane where the first direction and the second direction intersect, the deep trench and the shallow trench are disposed between two ground regions of the plurality of ground regions disposed along the first direction and the deep trench is disposed between two ground regions of the plurality of ground regions disposed along the second direction.

2. The image sensor of claim 1, wherein a first distance between the two ground regions disposed along the first direction is wider than a second distance between the two ground regions disposed along the second direction on the plane where the first direction and the second direction intersect.

3. The image sensor of claim 2, further comprising:
a pixel separation structure disposed within the deep trench; and
an element separation film disposed within the shallow trench,
wherein first edges parallel to the second direction of the two ground regions disposed along the first direction contact the element separation film, and wherein second edges parallel to the first direction of the two ground regions disposed along the second direction contact the pixel separation structure.

4. The image sensor of claim 3, wherein each second depth of the second edges is greater than each first depth of the first edges along the depth direction.

5. The image sensor of claim 1, wherein the plurality of ground regions are disposed at a central portion of a region where the plurality of pixel regions are disposed, the central portion located between each of the plurality of pixel regions.

6. The image sensor of claim 5, wherein the plurality of pixel regions include a first pixel and a second pixel adjacent to each other along the first direction and a third pixel and a fourth pixel adjacent to each other along the first direction, and the first pixel and the third pixel are adjacent to each other along the second direction and the second pixel and the fourth pixel are adjacent to each other along the second direction.

7. The image sensor of claim 6, wherein the plurality of ground regions include a first ground region disposed at the first pixel, a second ground region disposed at the second pixel, a third ground region disposed at the third pixel, and a fourth ground region disposed at the fourth pixel,
wherein the deep trench and the shallow trench parallel to the second direction are disposed between the first ground region and the second ground region and between the third ground region and the fourth ground region, and the deep trench parallel to the first direction is disposed between the first ground region and the third ground region and between the second ground region and the fourth ground region.

8. The image sensor of claim 7, wherein a first distance between the first ground region and the second ground region is wider than a second distance between the first ground region and the third ground region on the plane where the first direction and the second direction intersect.

9. The image sensor of claim 8, further comprising:

a pixel separation structure disposed within the deep trench; and an element separation film disposed within the shallow trench, wherein first edges parallel to the second direction of the first ground region and the second direction of the second ground region contact the element separation film, and second edges parallel to the first direction of the first ground region and the first direction of the third ground region contact the pixel separation structure.

10. The image sensor of claim 9, wherein each second depth of the second edges is greater than each first depth of the first edges along the depth direction.

* * * * *